(12) United States Patent
Wu et al.

(10) Patent No.: US 11,594,620 B2
(45) Date of Patent: Feb. 28, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Wei Cheng Wu, Zhubei (TW); Li-Feng Teng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 124 days.

(21) Appl. No.: 17/202,170

(22) Filed: Mar. 15, 2021

(65) Prior Publication Data

US 2021/0202721 A1 Jul. 1, 2021

Related U.S. Application Data

(60) Division of application No. 16/203,352, filed on Nov. 28, 2018, now Pat. No. 10,950,715, which is a
(Continued)

(51) Int. Cl.
*H01L 29/66* (2006.01)
*H01L 21/28* (2006.01)
(Continued)

(52) U.S. Cl.
CPC .. *H01L 29/66825* (2013.01); *H01L 21/76224* (2013.01); *H01L 21/76229* (2013.01);
(Continued)

(58) Field of Classification Search
CPC ......... H01L 29/66825; H01L 21/76224; H01L 21/76229; H01L 27/11521;
(Continued)

(56) References Cited

U.S. PATENT DOCUMENTS 7,005,345 B2 2/2006 Yaegashi et al.
8,101,477 B1 1/2012 Power
(Continued)

FOREIGN PATENT DOCUMENTS

CN 105321950 A 2/2016
JP 2011232623 A 11/2011
(Continued)

OTHER PUBLICATIONS

Office Action issued in U.S. Appl. No. 15/428,823, dated Jan. 25, 2018.
(Continued)

*Primary Examiner* — Mohammad M Hoque
(74) *Attorney, Agent, or Firm* — McDermott Will & Emery LLP (57) ABSTRACT

A semiconductor device includes a non-volatile memory. The non-volatile memory includes a first dielectric layer disposed on a substrate, a floating gate disposed on the dielectric layer, a control gate, a second dielectric layer disposed between the floating gate and the control gate and having one of a silicon oxide layer, a silicon nitride layer and multilayers of silicon oxide and silicon nitride, and an erase gate and a select gate. The erase gate and the select gate include a stack of a bottom polysilicon layer and an upper metal layer.

20 Claims, 11 Drawing Sheets

Related U.S. Application Data continuation of application No. 15/648,201, filed on Jul. 12, 2017, now Pat. No. 10,943,996.

(60) Provisional application No. 62/427,484, filed on Nov. 29, 2016.

(51) Int. Cl.

| | |
|---|---|
| H01L 27/11546 | (2017.01) |
| H01L 21/762 | (2006.01) |
| H01L 27/11521 | (2017.01) |
| H01L 27/11531 | (2017.01) |
| H01L 27/11548 | (2017.01) |
| H01L 29/06 | (2006.01) |
| H01L 29/423 | (2006.01) |
| H01L 29/788 | (2006.01) |

(52) U.S. Cl.
CPC .. *H01L 27/11521* (2013.01); *H01L 27/11531* (2013.01); *H01L 27/11546* (2013.01); *H01L 27/11548* (2013.01); *H01L 29/0649* (2013.01); *H01L 29/40114* (2019.08); *H01L 29/42328* (2013.01); *H01L 29/66545* (2013.01); *H01L 29/788* (2013.01)

(58) Field of Classification Search
CPC ......... H01L 27/11531; H01L 27/11546; H01L 27/11548; H01L 29/0649; H01L 29/40114; H01L 29/42328; H01L 29/66545; H01L 29/788; H01L 27/11526; H01L 29/401; H01L 27/11568
USPC ......................................................... 257/319
See application file for complete search history.

(56) References Cited

U.S. PATENT DOCUMENTS

| | | | |
|---|---|---|---|
| 8,669,607 | B1 | 3/2014 | Tsair et al. |
| 8,883,592 | B2 | 11/2014 | Kotov et al. |
| 9,276,006 | B1 | 3/2016 | Chen et al. |
| 9,349,741 | B2 | 5/2016 | Liu |
| 9,583,591 | B2 | 2/2017 | Chuang et al. |
| 9,583,640 | B1 | 2/2017 | Richter |
| 9,634,019 | B1 | 4/2017 | Zhou et al. |
| 9,673,338 | B2 | 6/2017 | Fan et al. |
| 9,728,544 | B2 | 8/2017 | Yu et al. |
| 9,842,848 | B2 | 12/2017 | Wu et al. |
| 9,865,610 | B2 | 1/2018 | Chuang et al. |
| 2004/0130947 | A1* | 7/2004 | Fan ............... H01L 29/42328 257/E21.422 |
| 2004/0256657 | A1 | 12/2004 | Hung et al. |
| 2006/0108628 | A1 | 5/2006 | Hung et al. |
| 2006/0203552 | A1 | 9/2006 | Chen et al. |
| 2008/0029805 | A1 | 2/2008 | Shimamoto et al. |
| 2008/0105917 | A1 | 5/2008 | Hsieh et al. |
| 2008/0315281 | A1 | 12/2008 | Park |
| 2009/0134453 | A1 | 5/2009 | Govoreanu et al. |
| 2009/0207662 | A1 | 8/2009 | Wang et al. |
| 2014/0227839 | A1 | 8/2014 | Shinohara |
| 2015/0008451 | A1* | 1/2015 | Su ..................... H01L 29/1608 438/257 |
| 2015/0021679 | A1 | 1/2015 | Tsair et al. |
| 2015/0035040 | A1 | 2/2015 | Yoo |
| 2015/0060989 | A1 | 3/2015 | Loiko et al. |
| 2015/0087123 | A1 | 3/2015 | Wu |
| 2015/0137207 | A1 | 5/2015 | Chuang et al. |
| 2015/0263010 | A1 | 9/2015 | Chuang et al. |
| 2015/0280004 | A1 | 10/2015 | Wu et al. |
| 2016/0013197 | A1 | 1/2016 | Liu |
| 2016/0013198 | A1 | 1/2016 | Liu |
| 2016/0064389 | A1 | 3/2016 | Mihara |
| 2016/0141296 | A1 | 5/2016 | Yang et al. |
| 2016/0148944 | A1 | 5/2016 | Yu |
| 2016/0163722 | A1 | 6/2016 | Chang et al. |
| 2016/0190146 | A1 | 6/2016 | Zhang |
| 2016/0197088 | A1 | 7/2016 | Chen et al. |
| 2016/0218110 | A1* | 7/2016 | Yang ................... H01L 29/7881 |
| 2016/0293427 | A1 | 10/2016 | Mihara et al. |
| 2017/0025427 | A1 | 1/2017 | Su |
| 2017/0098654 | A1 | 4/2017 | Zhou et al. |
| 2017/0103989 | A1 | 4/2017 | Su et al. |
| 2017/0125603 | A1 | 5/2017 | Zhou et al. |
| 2017/0162590 | A1 | 6/2017 | Chuang et al. |
| 2018/0012898 | A1 | 1/2018 | Wu et al. |
| 2018/0151580 | A1 | 5/2018 | Wu et al. |
| 2018/0151581 | A1 | 5/2018 | Wu et al. |
| 2018/0151707 | A1 | 5/2018 | Wu et al. |
| 2018/0254281 | A1 | 9/2018 | Bo et al. |

FOREIGN PATENT DOCUMENTS

| | | | |
|---|---|---|---|
| JP | 2012248652 | A | 12/2012 |
| JP | 2016-051735 | A | 4/2016 |
| KR | 10-2015-0056441 | A | 5/2015 |
| TW | 546842 | B | 8/2003 |
| TW | 200746369 | A | 12/2007 |
| TW | 200816391 | A | 4/2008 |
| TW | 201547008 | A | 12/2015 |
| TW | 201640621 | A | 11/2016 |

OTHER PUBLICATIONS

Notice of Allowance dated Aug. 6, 2018 in U.S. Appl. No. 15/428,823 (15 pages).
Notice of Allowance dated Oct. 25, 2018 in U.S. Appl. No. 15/584,314 (16 pages).
Non-final Office Action dated Apr. 13, 2018 in U.S. Appl. No. 15/584,314 (18 pages).
Office Action dated Mar. 22, 2018 in corresponding German Patent Application No. 10 2017 116 221.6 (8 pages).
Notice of Reason for Refusal dated Oct. 3, 2018 in corresponding Korean Application No. 10-2017-0097516, including English translation (13 pages).
Office Action issued in corresponding U.S. Appl. No. 15/428,823 dated Jul. 14, 2017.
Office Action issued in corresponding Korean Patent Application No. 10-2017-0123215, dated Nov. 30, 2018.
Non-final Office Action issued in related U.S. Appl. No. 15/648,201, dated Jun. 13, 2019.
Final Office Action issued in corresponding U.S. Appl. No. 16/427,733 dated Apr. 14, 2020.
Non-Final Office Action issued in corresponding U.S. Appl. No. 16/368,814, dated Apr. 28, 2020.
Non-Final Office Action issued in corresponding U.S. Appl. No. 15/648,201, dated May 14, 2020.
Notice of Allowance issued in corresponding U.S. Appl. No. 16/427,733, dated Jul. 16, 2020.

* cited by examiner

SEMICONDUCTOR DEVICE AND MANUFACTURING METHOD THEREOF

CROSS-REFERENCE TO RELATED APPLICATIONS

This application is a divisional application of application Ser. No. 16/203,352 filed on Nov. 28, 2018, which is a divisional application of application Ser. No. 15/648,201 filed on Jul. 12, 2017, which claims priority to U.S. Provisional Patent Application 62/427,484 filed Nov. 29, 2016, the entire disclosure of each of which is incorporated herein by reference.

TECHNICAL FIELD

The disclosure relates to semiconductor integrated circuits, more particularly to semiconductor devices including non-volatile memory cells and peripheral circuits, and manufacturing processes thereof.

BACKGROUND

As the semiconductor industry has progressed into nanometer technology process nodes in pursuit of higher device density, higher performance, and lower costs, there have been challenges in reducing contact resistance and suppressing an increase of the number of lithography operations.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the present embodiment, a semiconductor device includes non-volatile memory (NVM) cells and peripheral circuits such as logic circuits. The peripheral circuits may also include static random access memories (SRAMs). The NVM cells generally require a stacked structure in which plural layers, such as polysilicon layers, are stacked, while the peripheral logic circuits generally include field effect transistors (FETs) having a single polysilicon layer. Because of the structure differences, when, for example, an interlayer dielectric (ILD) layer is formed over the NVM cells and the peripheral logic circuits, there is a height difference in the ILD layer between an NVM cell area and a peripheral logic circuit area. Such a height difference may affect the performance of chemical mechanical polishing (CMP) on the ILD layer.

In the present disclosure, before fabricating the NVM cells and the peripheral logic circuits, a substrate in the NVM cell area is etched to make a "step" between the NVM cell area and the peripheral logic circuit area. The step height corresponds to the height difference when the ILD layer is formed if the step is otherwise not formed. Further, it is also noted that placement of devices should be avoided near the step.

FIGS. 1A-8C generally show exemplary cross sectional views illustrating a sequential process for manufacturing a semiconductor device including non-volatile memory cells and peripheral logic circuits according to one embodiment of the present disclosure. It is understood that additional operations can be provided before, during, and after processes shown by FIGS. 1A-8C, and some of the operations described below can be replaced or eliminated, for additional embodiments of the method.

Figure 1A:
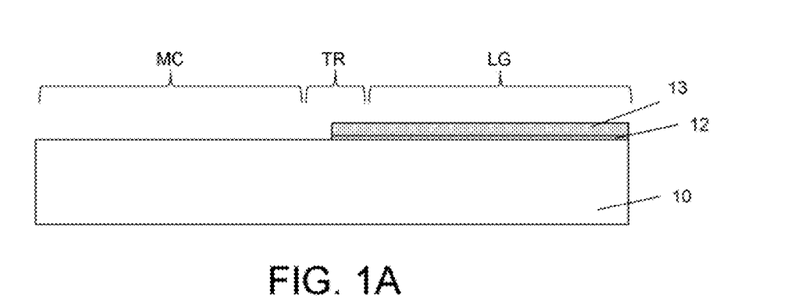
FIGS. 1A, 1B, 1C and 1D show exemplary cross sectional views illustrating a sequential process for manufacturing a semiconductor device including non-volatile memory cells and peripheral logic circuits according to one embodiment of the present disclosure.

As shown in FIG. 1A, a mask layer including, for example, a pad oxide layer 12 and a nitride layer 13 formed on the pad oxide layer 12 is formed on the substrate 10. A photo resist pattern (not shown) is formed over the nitride layer 13 by a lithography operation so as to cover the peripheral logic circuit area LG. By using the photo resist pattern as an etching mask, the NVM cell area MC is exposed, while the peripheral logic circuit area LG is covered by the nitride layer 13 and pad oxide layer 12. As shown in FIG. 1A, a transition area TR exists between the NVM cell area MC and the peripheral logic circuit area LG.

In one embodiment, the substrate 10 is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate. In some embodiments, the pad oxide layer 12 is thermally grown silicon oxide, and the nitride layer 13 is silicon nitride. The silicon oxide and the silicon nitride can be formed by using a furnace or chemical vapor deposition (CVD). Materials for the mask layer are not limited to silicon oxide and silicon nitride, and any other suitable material for a mask layer may be used. The thickness of the pad oxide layer 12 is in a range from about 3 nm to about 50 nm and the thickness of the nitride layer 13 is in a range from about 30 nm to about 200 nm in some embodiments.

Figure 1B:
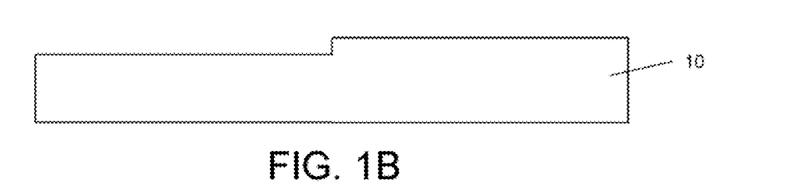

After the mask layer is patterned, the NVM cell area MC is oxidized by using wet oxidation, thereby forming an oxide layer, and then the oxide layer is removed by using wet etching, thereby forming a step between the NVM cell area MC and the peripheral logic circuit area LG. Then, the nitride layer 13 and pad oxide layer 12 are removed, as shown in FIG. 1B.

In certain embodiments, by using the pad oxide layer 12 and the nitride layer 13 as an etching mask, the substrate 10 in the NVM cell area MC is etched to form the step.

Figure 1C:
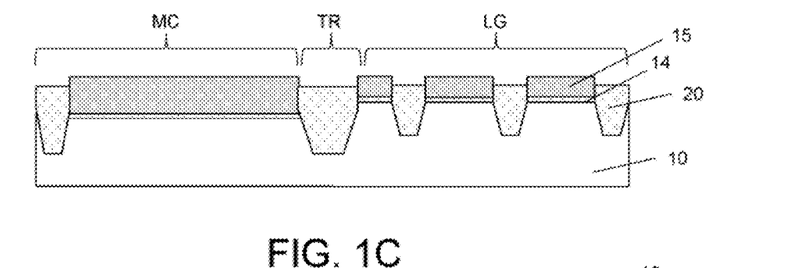

After the step is formed, isolation insulating layers 20, which are also called shallow trench isolation (STI), are formed, as shown in FIG. 1C. To form the isolation insulating layers 20, a mask layer including a silicon oxide layer 14 and a silicon nitride layer 15 is formed on the substrate 10, and the mask layer is patterned by lithography and etching operations. Then, by using the patterned mask layer as an etching mask, the substrate 10 is trench-etched to form trenches. A depth of the trenches is in a range from about 100 nm to about 1 μm in some embodiments.

The trenches are filled with an insulating (dielectric) material such as silicon oxide, and then, a planarization operation, such as CMP or an etch-back process, is performed so as to remove an upper part of the insulating material layer, thereby forming the isolation layers 20. The substrate not etched, and surrounded or separated by shallow trench isolation (STI) made of insulating material, such as silicon oxide, in plan view is an active region, over which transistors or other semiconductor devices are formed. As shown in FIG. 1C, the NVM cell area MC and the peripheral logic circuit area LG may be separated by a relatively large isolation layer 20 in the transition area TR. In some embodiments, after the isolation layers 20 are formed, the step between the cell area and the peripheral logic circuit area is maintained.

Figure 1D:
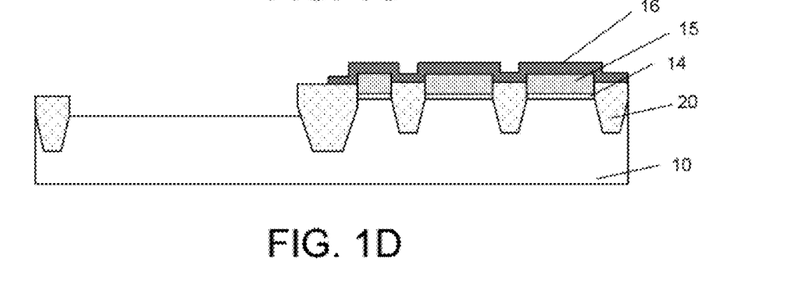

Further, the mask layer including a silicon oxide layer 14 and a silicon nitride layer 15 in the NVM cell area MC is removed, while the logic circuit area LG is covered by a protective layer 16 made of silicon nitride, as shown in FIG. 1D.

Figure 2A:
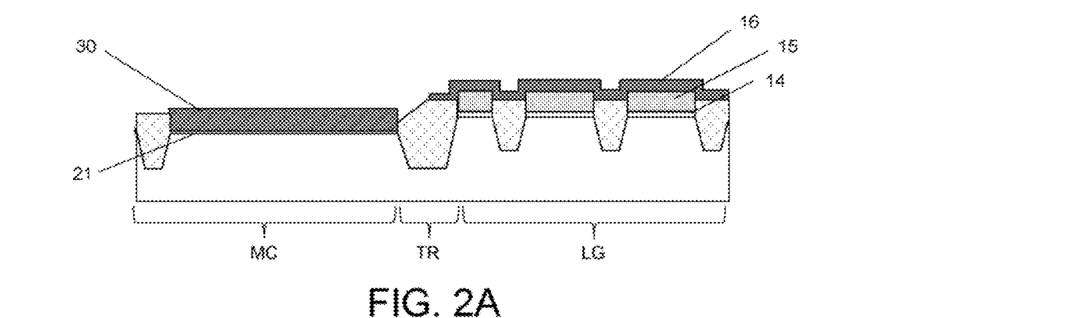
FIGS. 2A, 2B, 2C and 2D show exemplary cross sectional views illustrating a sequential process for manufacturing a semiconductor device including non-volatile memory cells and peripheral logic circuits according to one embodiment of the present disclosure.

Subsequently, as shown in FIG. 2A, a first dielectric layer 21 and a first polysilicon layer 30 are formed over the substrate 10 in the NVM cell area MC. The first dielectric layer 21 is utilized as a tunnel oxide layer for NVM cells and is made of silicon oxide. The thickness of the first dielectric layer 21 is in a range from about 1 nm to about 50 nm in some embodiments. The first dielectric layer 21 can be formed by thermal oxidation or CVD.

The first polysilicon layer 30 can be formed by CVD. The thickness of the first polysilicon layer 30 as deposited is in a range from about 10 nm to about 300 nm in some embodiments. Then, the thickness of the first polysilicon layer 30 is reduced by a planarization operation, such as a chemical mechanical polishing method or an etch-back method. After the planarization operation, the thickness of the first polysilicon layer 30 is in a range from about 10 nm to about 200 nm in some embodiments. The first polysilicon layer 30 is appropriately doped with impurities and is utilized for floating gates of NVM cells. The polysilicon layer 30 may be replaced with an amorphous silicon layer.

Figure 2B:
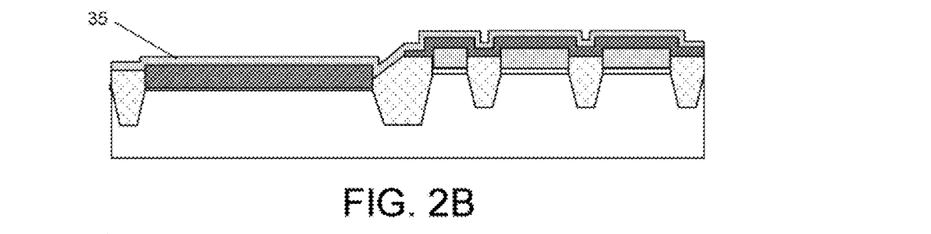

After the first polysilicon layer 30 is formed in the NVM cell area MC, a second dielectric layer 35 is formed, as shown in FIG. 2B. The second dielectric layer 35 includes a silicon oxide layer, a silicon nitride layer or multilayers of silicon oxide and silicon nitride. The thickness of the second dielectric layer is in a range from about 1 nm to about 100 nm in some embodiments. The second dielectric layer 35 can be formed by CVD and patterning operations including lithography and dry etching.

After the second dielectric layer 35 is formed, a second polysilicon layer 40 is formed over the NVM cell area MC and the logic circuit area LG. The second polysilicon layer 40 can be formed by CVD, and the thickness of the second polysilicon layer 40 is in a range from about 10 nm to about 100 nm, in some embodiments.

Figure 2C:
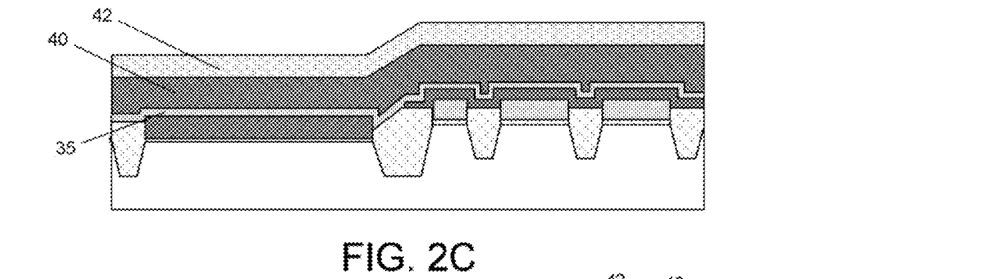

Further, as shown in FIG. 2C, a hard mask layer 42 is formed on the second polysilicon layer 40. In some embodiments, the hard mask layer 42 is made of silicon oxide formed by CVD, and the thickness thereof is in a range from about 10 nm to about 200 nm.

Figure 2D:
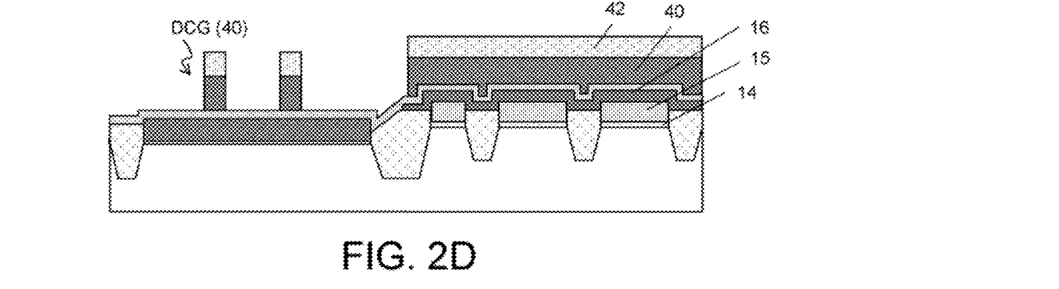

By using a patterning operation including lithography and etching, the hard mask layer 42 is patterned, and by using the patterned hard mask layer as an etching mask, the second polysilicon layer 40 is patterned as shown in FIG. 2D.

In the NVM cell area MC, the etching of the second polysilicon layer 40 substantially stops at the second dielectric layer 35. By this etching operation, dummy control gates DCG formed by the second polysilicon layer 40 are formed in the NVM cell area MC.

In this disclosure, "dummy" generally means a layer that is subsequently removed or replaced with another material, or a layer which does not function as a part of an active circuit. However, even if not mentioned as dummy, some layers may be subsequently replaced with another layer/material.

Figure 3A:
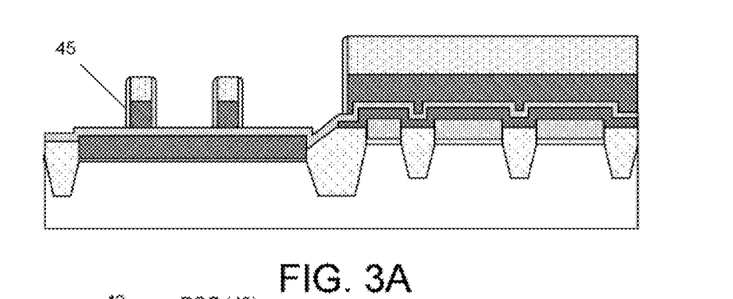
FIGS. 3A, 3B and 3C show exemplary cross sectional views illustrating a sequential process for manufacturing a semiconductor device including non-volatile memory cells and peripheral logic circuits according to one embodiment of the present disclosure.

After the patterning operation of the second polysilicon layer 40, first sidewall spacers 45 are formed on both sides of the patterned second polysilicon layers both in the NVM cell area MC and in the logic circuit area LG, as shown in FIG. 3A.

The first sidewall spacers 45 are made of silicon oxide in some embodiments. A blanket layer of silicon oxide is formed, for example by CVD, over the entire substrate and then anisotropic etching is performed, thereby forming the first sidewall spacers 45. The thickness of the first sidewall spacers 45 is in a range from about 1 nm to about 20 nm in some embodiments.

Figure 3B:
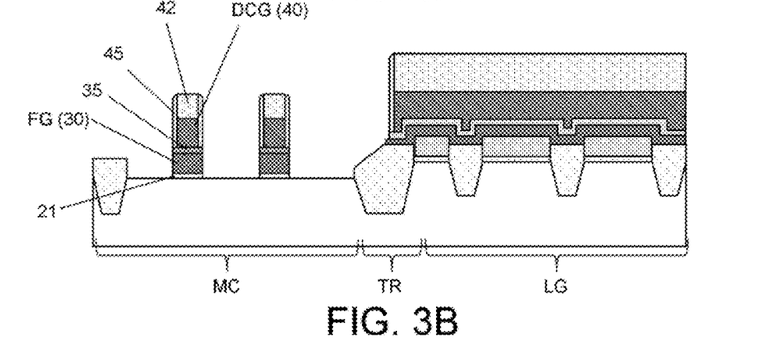
Figure 3C:
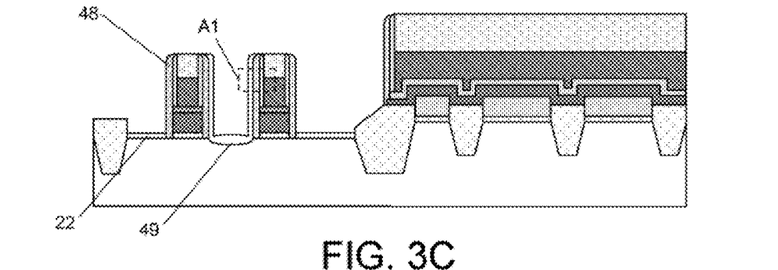
Figure 3D:
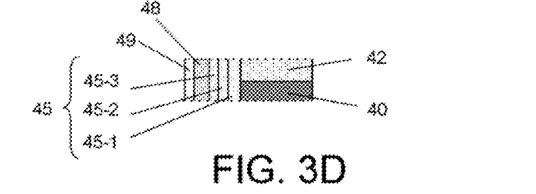
FIG. 3D shows an enlarged cross sectional view illustrating stacked structures corresponding to area A1 of FIG. 3C.

The first sidewall spacers 45 include an ONO film having a silicon nitride layer 45-2 sandwiched by two silicon oxide layers 45-1 and 45-3, as shown in FIG. 3D, which is an enlarged cross sectional view corresponding to area A1 of FIG. 3C. The thicknesses of the silicon oxide layer 45-1, the silicon nitride layer 45-2 and the silicon oxide layer 45-3 are in ranges about 1-20 nm, about 1-30 nm and about 1-20 nm, respectively, in some embodiments. In certain embodiments, the first sidewall spacers 45 are a single layer of silicon nitride or silicon oxynitride.

After the first sidewall spacers 45 are formed, the second dielectric layer 35 and the first polysilicon layer 30 are patterned by using dry etching operations, as shown in FIG. 3B. The second dielectric layer 35 is one of a silicon oxide layer, a silicon nitride layer and multilayers of silicon oxide and silicon nitride.

Further, as shown in FIG. 3C, second sidewall spacers 48 are formed, and an erase-gate oxide 49 is formed. The second sidewall spacers 48 are made of one or more layers of dielectric material. In one embodiment, the second sidewall spacers 48 are made of silicon nitride. The erase-gate oxide 49 is made of silicon oxide. In some embodiments, a silicon oxide layer is formed and then the silicon oxide layer is patterned to remove the silicon oxide layer from an erase gate area, and then wet oxidation is performed, thereby forming the erase-gate oxide 49. In certain embodiments, a gate dielectric layer 22 for select gates is also formed. In some embodiments, the first dielectric layer 21 remains as the gate dielectric layer 22.

Figure 4A:
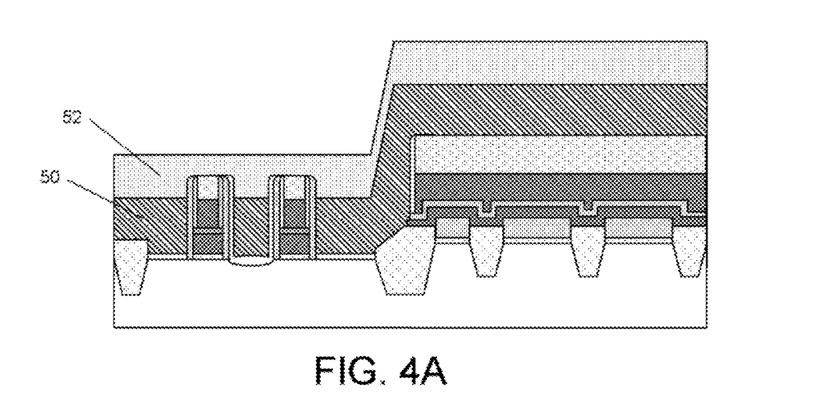
FIGS. 4A, 4B and 4C show exemplary cross sectional views illustrating a sequential process for manufacturing a semiconductor device including non-volatile memory cells and peripheral logic circuits according to one embodiment of the present disclosure.

Then, as shown in FIG. 4A, a third polysilicon layer 50 is formed over the substrate and a hard mask layer 52 made of silicon oxide is further formed on the third polysilicon layer. The thickness of the third polysilicon layer 50 is in a range from about 40 nm to about 200 nm in some embodiments.

Figure 4B:
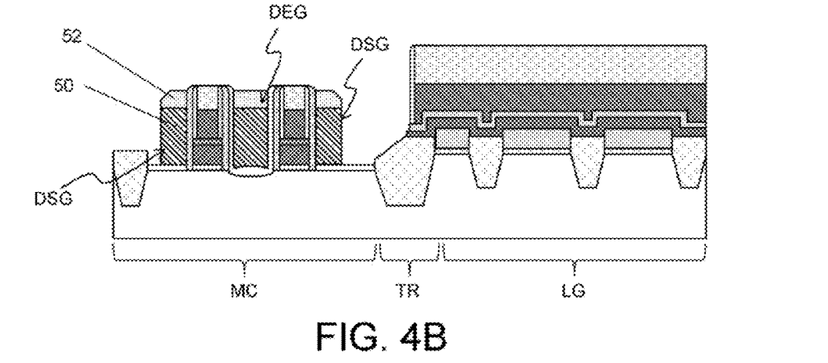

By using patterning operations, in the NVM cell area MC, an erase gate DEG is formed between the stacked structure and select gates SG (word lines) are formed at sides of the stacked structure at which the erase gate is not formed, thereby forming a memory cell structure, as shown in FIG. 4B. Since the third polysilicon layer 50 of the erase gate DEG and select gates DSG are subsequently replaced with a metal material in this embodiment, the erase gate DEG and select gates DSG are both dummy gates.

Figure 4C:
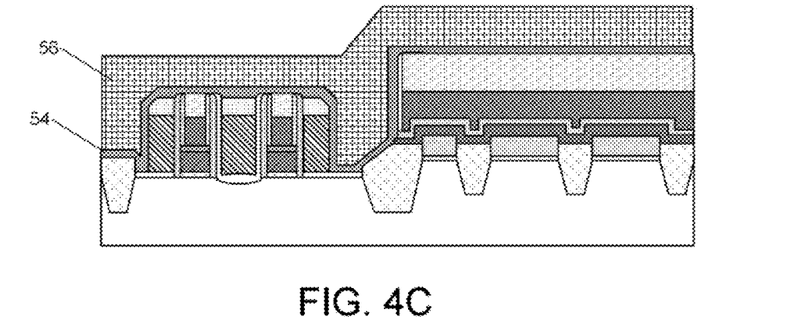

Subsequently, the memory cell structure is covered by a silicon oxide or nitride layer 54 and a protective layer 56, as shown in FIG. 4C. The protective layer 56 is made of polysilicon or amorphous silicon.

Figure 5A:
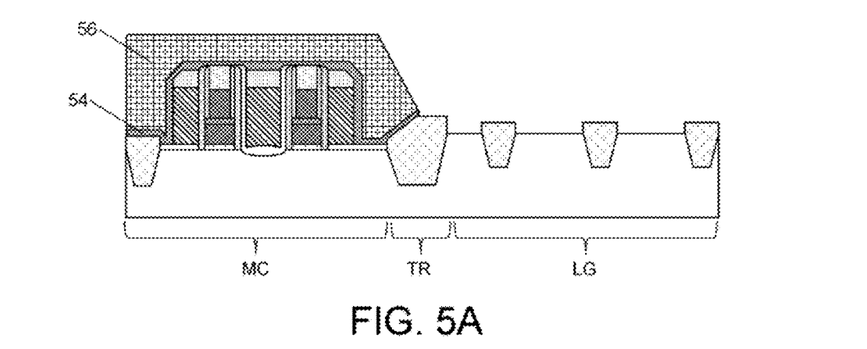
FIGS. 5A, 5B and 5C show exemplary cross sectional views illustrating a sequential process for manufacturing a semiconductor device including non-volatile memory cells and peripheral logic circuits according to one embodiment of the present disclosure.

Then, the stacked layers in the logic circuit area LG are removed, as shown in FIG. 5A.

Figure 5B:
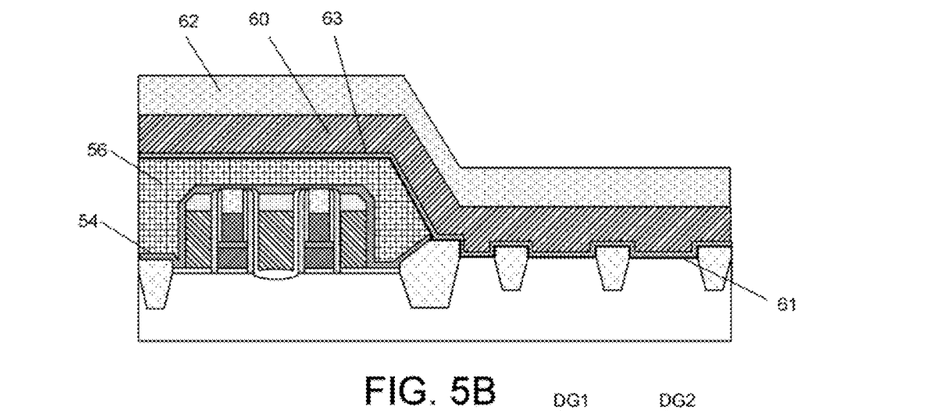

After the NVM cell area MC is covered, a gate dielectric layer 63 is formed over the NVM cell area MC and the logic circuit area LG, as shown in FIG. 5B.

The gate dielectric layer 63 includes one or more layers of a high-k dielectric material having a dielectric constant higher than silicon nitride. Typically, the dielectric constant of the high-k dielectric material is 10 or more. In some embodiments, the gate dielectric layer 63 includes one or more oxides of Hf, Y, Ta, Ti, Al and Zr, or any other suitable dielectric material. In certain embodiments, $HfO_2$ is used. In some embodiments, an interfacial layer 61 made of silicon oxide is formed before forming the high-k gate dielectric layer 63.

The gate dielectric layer 63 can be formed by CVD. The thickness of the gate dielectric layer 63 is in a range from about 1 nm to about 50 nm in some embodiments.

Further, as shown in FIG. 5B, a fourth polysilicon layer 60 is formed and a hard mask layer 62 is formed on the fourth polysilicon layer 60. The fourth polysilicon layer 60 can be formed by CVD, and the thickness of the fourth polysilicon layer 60 is in a range from about 10 nm to about 100 nm, in some embodiments. In some embodiments, the hard mask layer 62 is made of silicon oxide formed by CVD, and the thickness thereof is in a range from about 10 nm to about 200 nm.

Figure 5C:
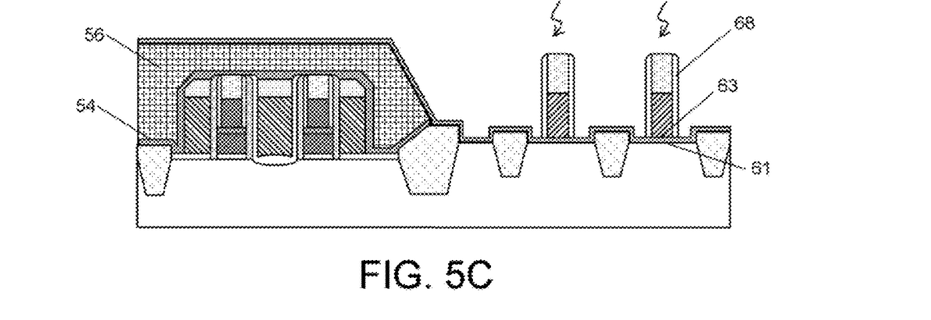

By using patterning operations including lithography and etching, the hard mask layer 62 is patterned, and by using the patterned hard mask layer as an etching mask, the fourth polysilicon layer 60 is patterned as shown in FIG. 5C. By this etching operation, a first dummy gate DG1 and a second dummy gate DG2, both formed by the fourth polysilicon layer 60, are formed in the logic circuit area LG.

After the patterning operation of the fourth polysilicon layer 60, third sidewall spacers 68 are formed on both opposing sides of the patterned fourth polysilicon layers in the logic circuit area LG, as shown in FIG. 5C.

The third sidewall spacers 68 are made of silicon oxide or SiN in some embodiments. A blanket layer of silicon oxide is formed, for example by CVD, over the entire substrate and then anisotropic etching is performed, thereby forming the third sidewall spacers 68. The thickness of the third sidewall spacers 68 is in a range from about 1 nm to about 20 nm in some embodiments.

Figure 6A:
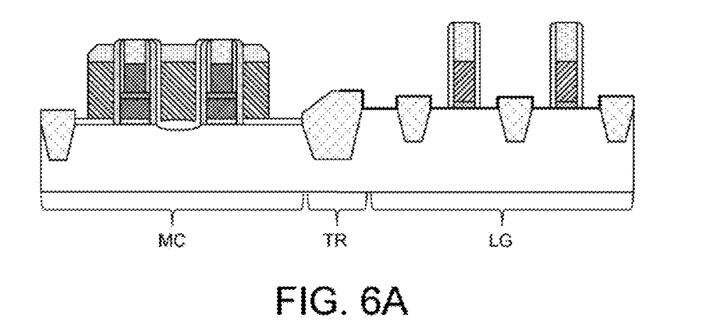
FIGS. 6A, 6B and 6C show exemplary cross sectional views illustrating a sequential process for manufacturing a semiconductor device including non-volatile memory cells and peripheral logic circuits according to one embodiment of the present disclosure.

After the dummy gates with the third sidewall spacers are formed, the cover layer 56 and the silicon oxide or nitride layer 54 are removed in the NVM cell area MC, as shown in FIG. 6A.

Figure 6B:
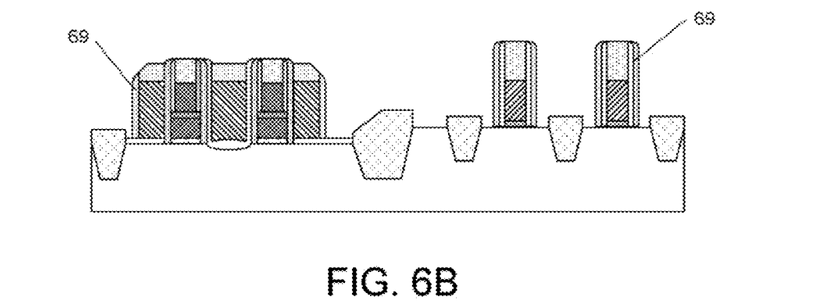

Then, as shown in FIG. 6B, fourth sidewall spacers 69 are formed both in the NVM cell area MC and in the logic circuit area LG. The fourth sidewall spacers 69 are made of silicon nitride with a thickness of about 1 nm to about 50 nm in some embodiments.

Figure 6C:
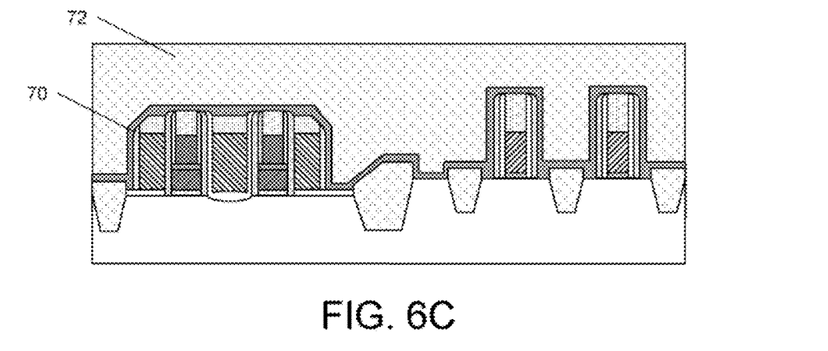

Further, a silicon nitride cover layer 70 is formed over the NVM cell area MC and the logic circuit area LG, and further, a first interlayer dielectric (ILD) layer 72 is formed on the silicon nitride cover layer 70, as shown in FIG. 6C.

The silicon nitride cover layer 70 can be formed by CVD, and has a thickness of about 1 nm to about 50 nm in some embodiments. The first ILD layer 72 includes one or more layers of SiO$_2$, SiN, SiOC, SiCN, SiOCN or SiON, or any other suitable dielectric material, and can be formed by CVD. The thickness of the first ILD layer 72 is in a range from about 50 nm to about 1000 nm so that the structures on the NVM cell area MC and the logic circuit area LG are fully embedded in the first ILD layer 72.

Figure 7A:
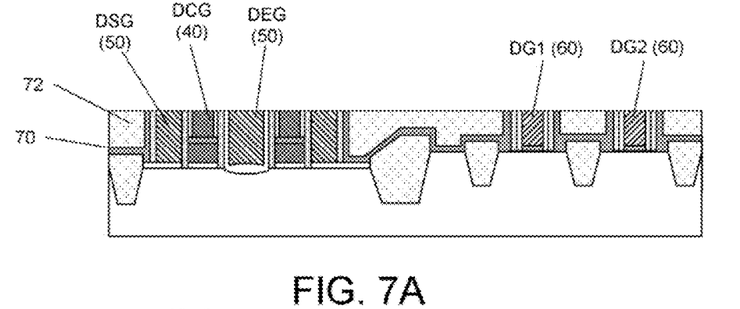
FIGS. 7A 7B and 7C show exemplary cross sectional views illustrating a sequential process for manufacturing a semiconductor device including non-volatile memory cells and peripheral logic circuits according to one embodiment of the present disclosure.

After the first ILD layer 72 is formed, the first ILD layer and the upper portions of the memory cell structure in the NVM cell area MC and the dummy gates in the logic circuit area LG are planarized by CMP, as shown in FIG. 7A. By the planarization operation using CMP, the upper portions of the dummy erase gate DEG and the dummy select gates DSG made of the third polysilicon layer 50, the upper portions of the dummy control gates DCG made of the second polysilicon layer 40, and the upper portions of the dummy gates DG1, DG2 made of the fourth polysilicon layer 60 are exposed, as shown in FIG. 7A.

Next, a first mask pattern 80 is formed so that the upper portions of the dummy control gates DCG, the dummy erase gate DEG and dummy select gates DSG and the upper portion of the dummy gate DG2 are exposed from the first mask pattern 80. Then, the third polysilicon layers 50 of the dummy erase gate DEG and dummy select gates DSG, the second polysilicon layers 40 of the dummy control gates DCG and the fourth polysilicon layer 60 of the dummy gate DG2 are removed so as to form openings 82, 81 and 83, respectively, as shown in FIG. 7B.

Figure 7B:
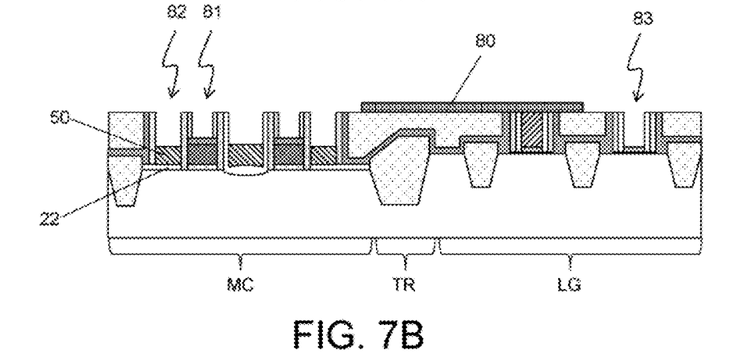

In this embodiment, the third polysilicon layers 50 of the dummy erase gate DEG and dummy select gates DSG are only partially removed and the third polysilicon layers 50 remain at the bottoms of the openings 82, as shown in FIG. 7B. Since the thickness of the third polysilicon layer 50 is much greater than the thickness of the second polysilicon layer 40 for the dummy control gates DCG and the fourth polysilicon layer 60 for the dummy gate DG2, the third polysilicon layers 50 remain at the bottoms of the openings 82 when the second and fourth polysilicon layers are fully removed by etching.

Figure 7C:
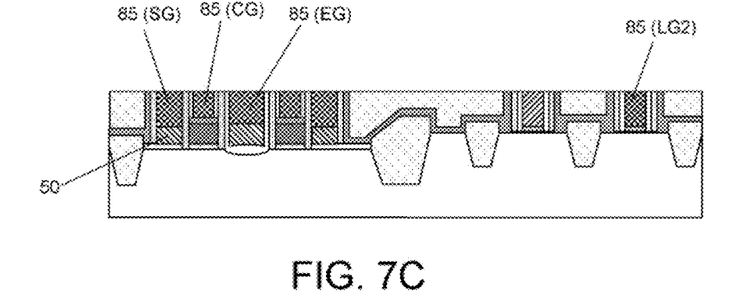

After the openings 82, 81 and 83 are formed, the openings are filled with one or more layers of first conductive material 85, as shown in FIG. 7C, so as to form a metal erase gate EG, metal select gates SG, metal control gates CG and a metal gate LG2. Since the third polysilicon layer 50 remains, the first conductive material 85 is formed on the remaining third polysilicon layers 50. In other words, the metal erase gate EG and the metal select gates SG include a polysilicon layer and a metal layer. In some embodiments, the first conductive material 85 includes a work function adjustment layer and a body metal layer.

In the present disclosure, the dummy gate DG1 is for either one of a p-channel FET and an n-channel FET and the dummy gate DG2 is for the other one of the p-channel FET and the n-channel FET. For the n-channel FET, one or more of TaN, TaAlC, TiN, TiC, Co, TiAl, TiSi and TaSi, or any other conductive material is used as the work function adjustment layer, and for the p-channel FET, one or more of TiAlC, Al, TiAl, TaN, TaAlC, TiN, TiC and Co, or any other suitable conductive material is used as the work function adjustment layer. In this embodiment, the work function adjustment layers for the p-channel FET and the n-channel FET are different from each other. The body metal layer for the p-channel FET and the n-channel FET may be the same or different, and includes one or more of Al, Cu, W, Ti, Ta, TiN, TiAl, TiAlC, TiAlN, TaN, NiSi, CoSi, and any other suitable conductive materials.

In one embodiment of the present disclosure, the dummy gate DG2 is for a p-channel FET. Thus, the structure of the first conductive material 85 for the control gate CG is the same as that of the gate LG2 of the p-channel FET.

The conductive material layer 85 can be formed by depositing a thick conductive material layers, and performing planarization operations, such as CMP so as to remove the conductive material layers deposited on the upper surface of the first ILD layer 72 The first mask pattern 80 is also removed during the CMP.

Figure 8A:
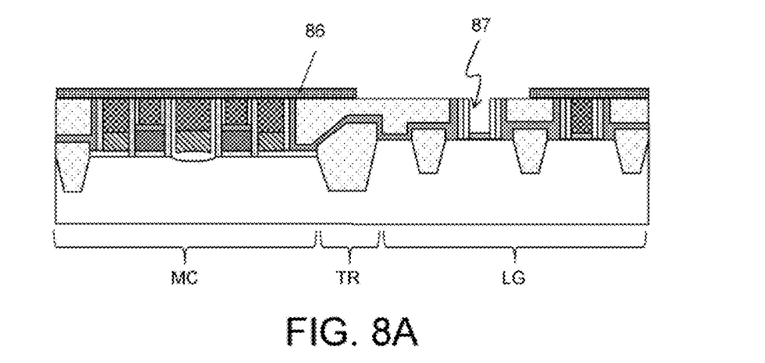
FIGS. 8A, 8B and 8C show exemplary cross sectional views illustrating a sequential process for manufacturing a semiconductor device including non-volatile memory cells and peripheral logic circuits according to one embodiment of the present disclosure.
Figure 8B:
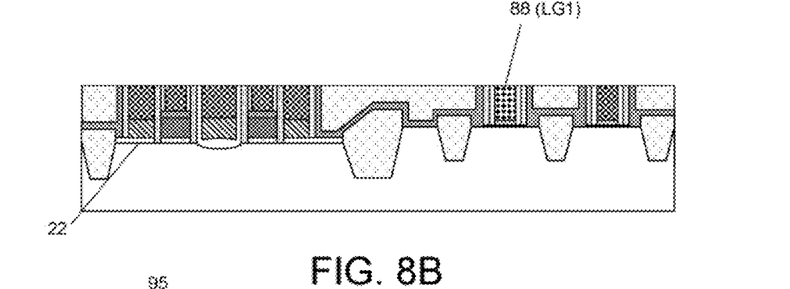

Then, a second mask pattern 86 is formed so that the upper portion of the dummy gate DG1 is exposed from the second mask pattern 86. The second mask pattern 86 is made of a photo resist in some embodiments, and is made of silicon nitride, aluminum oxide or transition metal nitride in other embodiments. Then, the fourth polysilicon layer 60 of the dummy gate DG1 is removed so as to form opening 87, as shown in FIG. 8A. Then, similar to the operations of FIG. 7C, the second conductive material layer 88 is formed in the opening 87 so as to form a metal gate LG1 for an n-channel FET, as shown in FIG. 8B.

Figure 8C:
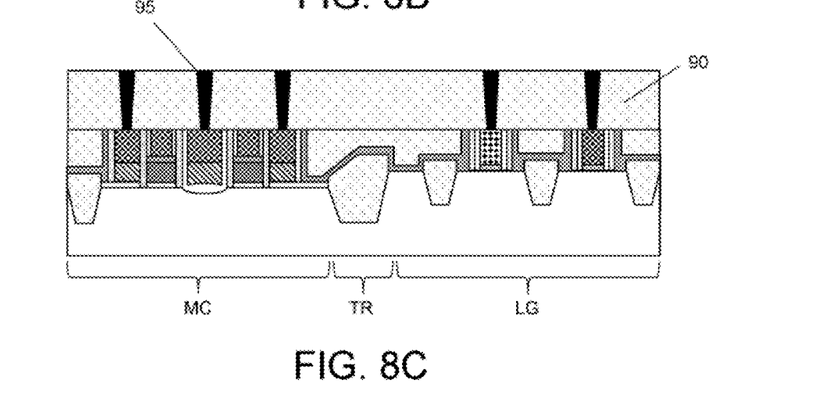

Subsequently, as shown in FIG. 8C, a second ILD layer 90 is formed over the structure shown in FIG. 8B, and contact plugs 95 are formed. The second ILD layer 90 includes one or more layers of silicon based insulating material, such as SiO$_2$, SiN, SiOC, SiCN, SiOCN or SiON, or any other suitable dielectric material formed by CVD. The thickness of the second ILD layer 90 is in a range from about 100 nm to about 1000 nm in some embodiments. The contact plugs 95 are made of conductive material including one or more of Al, Cu, W, Ti, Ta, TiN, TiAl, TiAlC, TiAlN, TaN, NiSi, CoSi, and any other suitable conductive materials. Although not shown in FIG. 8C, contact plugs 95 are also disposed on the control gates.

Figure 9A:
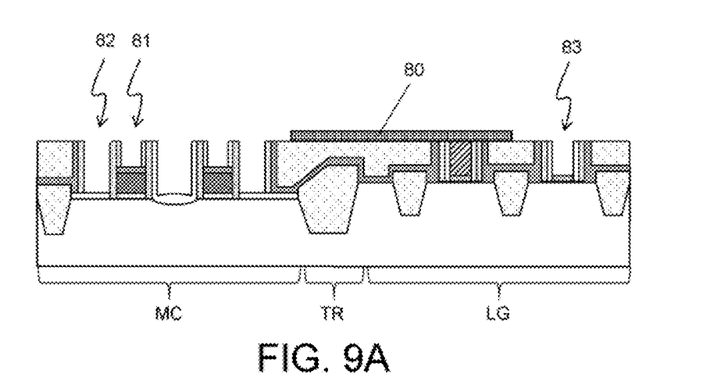
FIGS. 9A, 9B and 9C show exemplary cross sectional views illustrating a sequential process for manufacturing a semiconductor device including non-volatile memory cells and peripheral logic circuits according to another embodiment of the present disclosure.
Figure 9B:
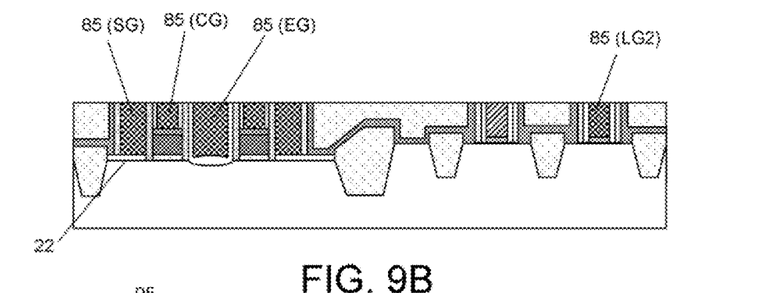
Figure 9C:
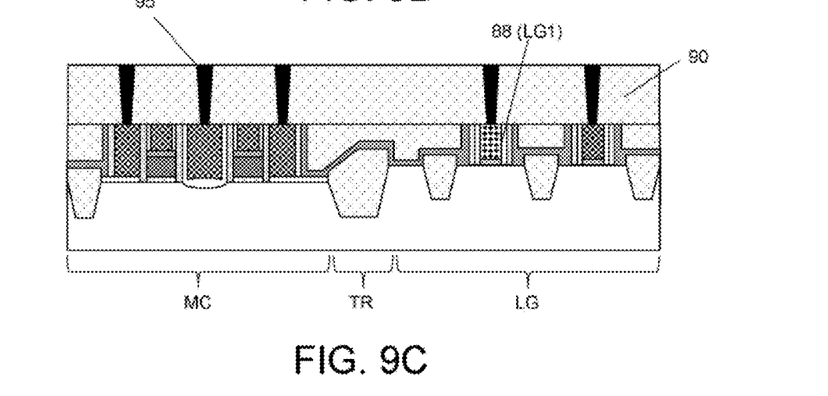

FIGS. 9A-9C show exemplary cross sectional views illustrating a sequential process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-8C may be employed in the following embodiment, and the detailed explanation thereof may be omitted. In the following embodiments, the third polysilicon layers of the dummy erase gate DEG and dummy select gates DSG are fully removed.

Similar to FIG. 7B, a second mask pattern 80 is formed so that the upper portions of the dummy control gates DCG, the dummy erase gate DEG and dummy select gates DSG and the upper portion of the dummy gate DG2 are exposed from the first mask pattern 80, as shown in FIG. 9A. Then, the third polysilicon layers 50 of the dummy erase gate DEG and dummy select gates DSG, the second polysilicon layers 40 of the dummy control gates DCG and the fourth polysilicon layer 60 of the dummy gate DG2 are removed so as to form openings 82, 81 and 83, respectively, as shown in FIG. 9A. As shown in FIG. 9A, the third polysilicon layers for the dummy erase gate DEG and dummy select gates DSG are fully removed.

Subsequently, similar to FIG. 7C, the openings are filled with one or more layers of first conductive material 85, as shown in FIG. 9B, so as to form a metal erase gate EG, metal select gates SG, metal control gates CG and a metal gate LG2 for a p-channel FET. Since the third polysilicon layers 50 are fully removed, the first conductive material 85 is formed on a gate dielectric layer 22 at the erase gate and select gates. After that, similar to the operations of FIGS. 8A and 8B, the second conductive material layer 88 is formed in the opening 87 so as to form a metal gate LG1 for an n-channel FET, as shown in FIG. 9C.

Subsequently, similar to FIG. 8C, the second ILD layer 90 is formed over the structure shown in FIG. 9B and contact plugs 95 are formed, as shown in FIG. 9C.

Figure 10A:
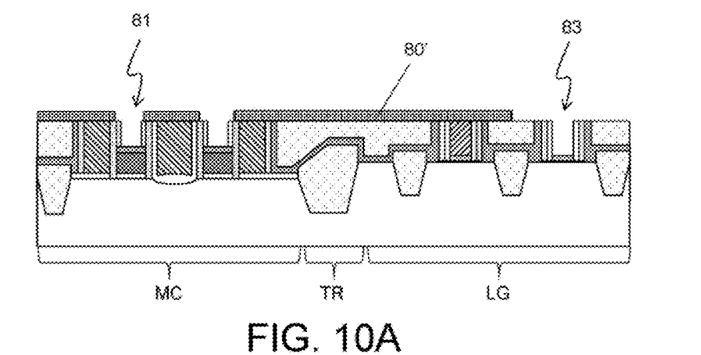
FIGS. 10A, 10B and 10C show exemplary cross sectional views illustrating a sequential process for manufacturing a semiconductor device including non-volatile memory cells and peripheral logic circuits according to another embodiment of the present disclosure.
Figure 10B:
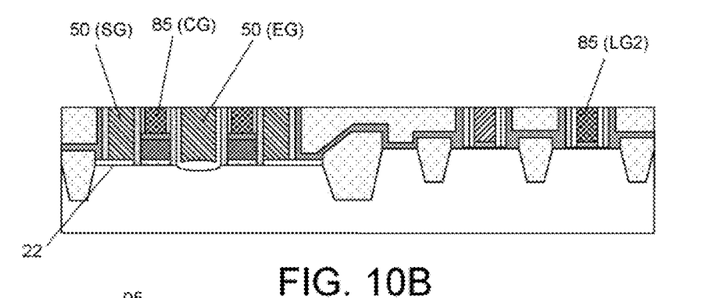
Figure 10C:
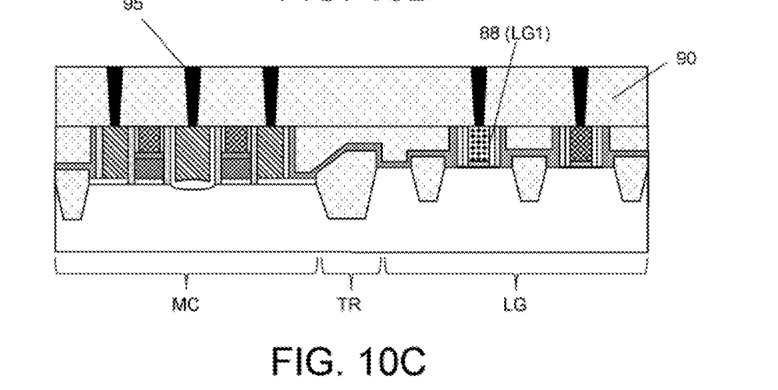

FIGS. 10A-10C show exemplary cross sectional views illustrating a sequential process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-9B may be employed in the following embodiment, and the detailed explanation thereof may be omitted. In the following embodiments, the polysilicon layers of the erase gate and select gates are not replaced with first conductive material 85 (i.e., they are not dummy gates) and thus are formed by the polysilicon layer 50.

As shown in FIG. 10A, a first mask pattern 80' is formed so that the upper portions of the dummy control gates DCG, and the upper portion of the dummy gate DG2 are exposed from the first mask pattern 80'. The first mask pattern 80' is made of a photo resist in some embodiments, and is made of silicon nitride, aluminum oxide or transition metal nitride in other embodiments. Then, the second polysilicon layers 40 of the dummy control gates DCG and the fourth polysilicon layer 60 of the dummy gate DG2 are removed so as to form openings 81 and 83, respectively, as shown in FIG. 10A.

After the openings 81 and 83 are formed, the openings are filled with one or more layers of first conductive material 85, as shown in FIG. 10B.

After that, similar to the operations of FIGS. 8A and 8B, the second conductive material layer 88 is formed so as to form a metal gate LG1 for an n-channel FET, as shown in FIG. 9C. Subsequently, similar to FIG. 8C, the second ILD layer 90 is formed and contact plugs 95 are formed, as shown in FIG. 10C.

Figure 11A:
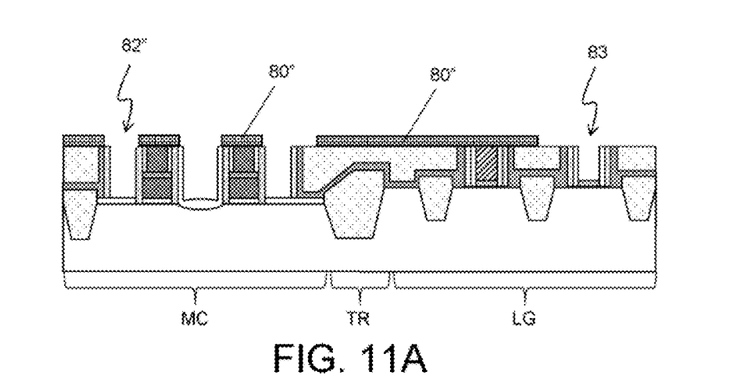
FIGS. 11A, 11B and 11C show exemplary cross sectional views illustrating a sequential process for manufacturing a semiconductor device including non-volatile memory cells and peripheral logic circuits according to another embodiment of the present disclosure.
Figure 11B:
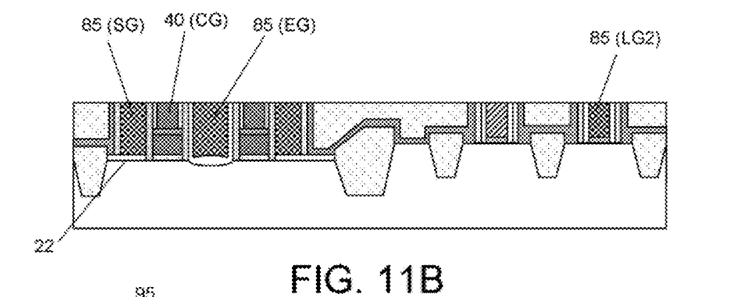
Figure 11C:
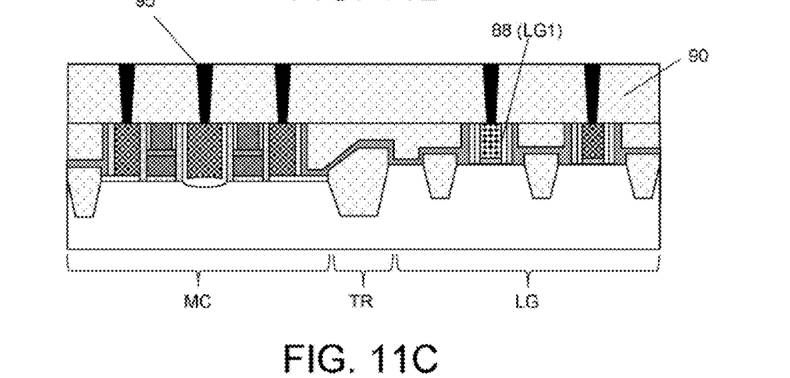

FIGS. 11A-11C show exemplary cross sectional views illustrating a sequential process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-10C may be employed in the following embodiment, and the detailed explanation thereof may be omitted. In the following embodiments, the polysilicon layers 40 of the control gates are not replaced with a first conductive material 85 and thus are formed by the polysilicon layer 40 (i.e., the polysilicon layers 40 are not dummy gates).

Similar to FIG. 7B, a first mask pattern 80" is formed so that the upper portions of the dummy erase gate DEG and dummy select gates DSG and the upper portion of the dummy gate DG2 are exposed from the first mask pattern 80", as shown in FIG. 11A. Then, the third polysilicon layers 50 of the dummy erase gate DEG and dummy select gates DSG and the fourth polysilicon layer 60 of the dummy gate DG2 are removed so as to form openings 82" and 83, respectively, as shown in FIG. 11A. As shown in FIG. 11A, the third polysilicon layers 50 for the dummy erase gate DEG and dummy select gates DSG are fully removed in one embodiment. In other embodiments, similar to FIG. 7B, the third polysilicon layers 50 for the dummy erase gate DEG and dummy select gates DSG are only partially removed and remain at the bottoms of the openings.

Subsequently, similar to FIG. 7C or 9B, the openings 82" and 83 are filled with one or more layers of first conductive material 85, as shown in FIG. 11B, so as to form a metal erase gate EG, metal select gates SG and a metal gate LG2 for a p-channel FET.

After that, similar to the operations of FIGS. 8A and 8B, the second conductive material layer 88 is formed so as to form a metal gate LG1 for an n-channel FET. Subsequently, similar to FIG. 8C, the second ILD layer 90 is formed and contact plugs 95 are formed, as shown in FIG. 11C.

In the forgoing embodiments, the gate LG1 is for an n-channel FET and the gate LG2 is for a p-channel FET. In certain embodiments, the gate LG1 is for a p-channel FET and the gate LG2 is for an n-channel FET. In such a case, the same conductive material structure 85 is used for the gates of the NVM cells and the gate of the n-channel FET. In other words, the metal gates for the NVM cells has the same conductive metal structure as either one of a p-channel FET or an n-channel FET in the logic circuit area LG.

It will be understood that not all advantages have been necessarily discussed herein, no particular advantage is required for all embodiments or examples, and other embodiments or examples may offer different advantages.

According to some embodiments of the present disclosure, since the erase gate and select gates of the NVM cells are made of metal material, resistance of these gates and contact resistance between the gates and the contact plugs can be reduced. Further, according to some embodiments of the present disclosure, since the control gates of the NVM cells are made of metal material, resistance of the control gates can be reduced. Further, since the gate replacement process is performed for the NVM cell area and the logic circuit area at the same time, it is possible to minimize an increase of the number of lithograph operations.

In accordance with one aspect of the present disclosure, in a method for manufacturing a semiconductor device including a non-volatile memory, a cell structure is formed. The cell structure includes a stacked structure including a first polysilicon layer disposed over a first dielectric layer, a second dielectric layer disposed over the first polysilicon layer and a second polysilicon layer disposed over the second dielectric layer, and third polysilicon layers disposed at both sides of the stacked structure. The third polysilicon layers are at least partially removed, thereby forming an erase gate space and a select gate space. A conductive material is formed in the erase gate space and the select gate space.

In accordance with another aspect of the present disclosure, in a method for manufacturing a semiconductor device including a non-volatile memory disposed in a memory cell area and a field effect transistor disposed in a logic circuit area, a cell structure for the non-volatile memory in the memory cell area is formed. The cell structure includes a stacked structure including a first polysilicon layer disposed over a first dielectric layer, a second dielectric layer disposed over the first polysilicon layer and a second polysilicon layer disposed over the second dielectric layer, and third polysilicon layers disposed at both sides of the stacked structure. A dummy gate structure for the field effect transistor in the logic circuit area is formed. The dummy gate structure includes a gate dielectric layer disposed over the substrate, and a dummy logic gate made of polysilicon and disposed over the gate dielectric layer. The third polysilicon layers and the dummy logic gate are at least partially removed, thereby forming an erase gate space and a select gate space in the memory cell area and a logic gate space in the logic circuit area. A conductive material is in the erase gate space, the select gate space and the logic gate space.

In accordance with another aspect of the present disclosure, a semiconductor device includes a non-volatile memory. The non-volatile memory includes a first dielectric layer disposed on a substrate, a floating gate disposed on the dielectric layer, a control gate, a second dielectric layer disposed between the floating gate and the control gate and having one of a silicon oxide layer, a silicon nitride layer and multilayers of silicon oxide and silicon nitride, and an erase gate and a select gate. The erase gate and the select gate include a stack of a bottom polysilicon layer and an upper metal layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device including a non-volatile memory, the method comprising:
    forming a cell structure, the cell structure including:
        a stacked structure including a first polysilicon layer disposed over a first dielectric layer, a second dielectric layer disposed over the first polysilicon layer, and a second polysilicon layer disposed over the second dielectric layer; and
        third polysilicon layers disposed at both sides of the stacked structure;
    forming a mask pattern over the cell structure, the mask pattern including openings over the second polysilicon layers and being in contact with the third polysilicon layer;
    removing the second polysilicon layers by using the mask pattern as an etching mask, thereby forming a control gate space, and not removing the third polysilicon layers;
    forming a conductive material in the control gate space, thereby forming a control gate electrode; and
    forming an interlayer dielectric layer over the control gate electrode, an erase gate electrode and an select gate electrode, the select gate electrode and the erase gate electrode being made of the third polysilicon layer.

2. The method of claim 1, wherein the forming the cell structure comprises:
    forming the first dielectric layer over a substrate;
    forming a first polysilicon film for the first polysilicon layer over the first dielectric layer;
    forming a second dielectric film for the second dielectric layer over the first polysilicon film;
    forming a second polysilicon film for the second polysilicon layer over the second dielectric film;
    patterning the second polysilicon film, thereby forming the second polysilicon layer;
    after the second polysilicon layer is formed, patterning the second dielectric film and the first polysilicon film, thereby forming the stacked structure;
    forming third polysilicon films for the third polysilicon layers at both sides of the stacked structure; and
    performing a planarization operation on the stacked structure and the third polysilicon films, thereby forming the third polysilicon layers and exposing the second polysilicon layer.

3. The method of claim 2, further comprising, after the second polysilicon film is patterned and before the second dielectric film and the first polysilicon film are patterned, forming first sidewall spacers on both sides of the second polysilicon layer.

4. The method of claim 3, further comprising, after the second dielectric film and the first polysilicon film are patterned, forming second sidewall spacers.

5. The method of claim 4, wherein the first sidewall spacers include an ONO film having silicon nitride layer sandwiched by two silicon oxide layers.

6. The method of claim 1, wherein the mask pattern is made of a photo resist.

7. The method of claim 1, wherein the mask pattern is made of silicon nitride, aluminum oxide or transition metal nitride.

8. The method of claim 1, wherein:
    the second polysilicon layers are fully removed, and no second polysilicon layer remains in the control gate space, and
    the conductive material is formed directly on the second dielectric layer in the control gate space.

9. A method for manufacturing a semiconductor device including a non-volatile memory disposed in a memory cell area and a field effect transistor disposed in a logic circuit area, the method comprising:
    forming a cell structure for the non-volatile memory in the memory cell area, the cell structure comprising:
        a stacked structure including a first polysilicon layer disposed over a first dielectric layer, a second dielectric layer disposed over the first polysilicon layer, and a second polysilicon layer disposed over the second dielectric layer; and
        third polysilicon layers disposed at both sides of the stacked structure;
    forming a dummy gate structure for the field effect transistor in the logic circuit area, the dummy gate structure comprising:
        a gate dielectric layer disposed over the substrate; and
        a dummy logic gate made of polysilicon and disposed over the gate dielectric layer;
    removing the second polysilicon layers, thereby forming a control gate space in the memory cell area and not removing the third polysilicon layer, and removing the dummy logic gate, thereby forming a logic gate space in the logic circuit area;
    forming a conductive material in the control gate space and the logic gate space, thereby forming a control gate electrode and a logic gate electrode; and
    forming an interlayer dielectric layer over the control gate electrode, a erase gate electrode, a select gate electrode and a logic gate electrode, the erase gate electrode and the select gate electrode being made of the third polysilicon layer.

10. The method of claim 9, wherein:
    the forming the cell structure comprises:

forming the first dielectric layer over a substrate;
forming a first polysilicon film for the first polysilicon layer over the first dielectric layer;
forming a second dielectric film for the second dielectric layer over the first polysilicon film;
forming a second polysilicon film for the second polysilicon layer over the second dielectric film;
patterning the second polysilicon film, thereby forming the second polysilicon layer;
after the second polysilicon layer is formed, patterning the second dielectric film and the first polysilicon film, thereby forming the stacked structure;
forming third polysilicon films for the third polysilicon layers at both sides of the stacked structure, and
the forming the dummy gate structure comprises:
after the memory cell structure is formed, covering the memory cell area with a cover layer,
with the memory cell area being covered by the cover layer,
forming the gate dielectric layer over the substrate;
forming a fourth polysilicon film for the dummy logic gate over the gate dielectric layer; and
patterning the fourth polysilicon film, thereby forming the dummy logic gate; and
after the dummy gate structure is formed, removing the cover layer.

11. The method of claim 10, further comprising, after the second polysilicon film is patterned and before the second dielectric film and the first polysilicon film are patterned, forming first sidewall spacers on both sides of the second polysilicon layer.

12. The method of claim 11, further comprising, after the second dielectric film and the first polysilicon film are patterned, forming second sidewall spacers.

13. The method of claim 12, wherein the first sidewall spacers include an ONO film having silicon nitride layer sandwiched by two silicon oxide layers.

14. The method of claim 10, wherein:
the gate dielectric layer includes one or more oxides of Hf, Y, Ta, Ti, Al and Zr, and
the method further comprises forming a transition metal nitride layer between the gate dielectric layer and the fourth polysilicon layer.

15. The method of claim 10, wherein:
the second dielectric layer is one of a silicon oxide layer, a silicon nitride layer and multilayers of silicon oxide and silicon nitride, and
the dummy logic gate does not include the second dielectric layer.

16. The method of claim 9, further comprising forming contact electrode to the control gate electrode, the erase gate electrode, the select gate electrode and the logic gate electrode, respectively.

17. A method for manufacturing a semiconductor device including a non-volatile memory, the method comprising:
forming a first dielectric layer over a substrate;
forming a first polysilicon layer over the first dielectric layer;
forming a second dielectric layer over the first polysilicon layer;
forming a second polysilicon layer over the second dielectric layer;
patterning the second polysilicon layer;
after the second polysilicon layer is patterned, patterning the second dielectric layer and the first polysilicon layer, thereby forming stacked structures including the second polysilicon layer, the second dielectric layer, the first polysilicon layer as a floating gate, and the first dielectric layer;
forming a third poly silicon layer so that an erase gate is formed between the stacked structure and selection gates are formed at sides of the stacked structure at which the erase gate are not formed;
performing a planarization operation, comprising a chemical mechanical polishing process, in the stacked structures and the third poly silicon layer such that the second polysilicon layer and the third polysilicon layer are exposed;
after the planarization operation is performed, removing the second polysilicon layer, thereby forming a control gate space, and not removing the third polysilicon layer;
forming a conductive material in the control gate space, thereby forming a control gate electrode; and
forming an interlayer dielectric layer over the control gate electrode, an erase gate electrode, and a select gate electrode, the erase gate electrode and the select gate electrode being made of the third polysilicon layer.

18. The method of claim 17, further comprising, after the third polysilicon layers are formed and before the planarization operation is performed:
forming a sidewall spacer on a side of each of the third polysilicon layers; and
forming a first cover layer over the sidewall spacer, the third polysilicon layers and the stacked structure.

19. The method of claim 18, wherein the first cover layer includes silicon nitride.

20. The method of claim 18, further comprising forming a second cover layer over the first cover layer.

* * * * *